United States Patent [19]

Norwood

[11] Patent Number: 4,801,469

[45] Date of Patent: Jan. 31, 1989

[54] PROCESS FOR OBTAINING MULTIPLE SHEET RESISTANCES FOR THIN FILM HYBRID MICROCIRCUIT RESISTORS

[75] Inventor: David P. Norwood, Albuquerque, N. Mex.

[73] Assignee: The United States of America as represented by the Department of Energy, Washington, D.C.

[21] Appl. No.: 894,145

[22] Filed: Aug. 7, 1986

[51] Int. Cl.$^4$ .................. B05D 5/12; H01C 17/06; H01C 1/012
[52] U.S. Cl. .................. 427/103; 427/102; 427/123; 427/125; 427/126.1; 29/620; 338/308; 338/314
[58] Field of Search .............. 338/306, 307, 308, 309, 338/312, 320, 314; 29/620, 610 R; 118/624; 427/101, 102, 103, 123, 125, 126.1

[56] References Cited

U.S. PATENT DOCUMENTS

| | | | |
|---|---|---|---|
| 3,458,847 | 7/1969 | Waits | 338/320 |
| 3,594,225 | 7/1971 | Waits | 117/212 |
| 3,864,825 | 2/1975 | Holmes | 29/621 |
| 3,896,284 | 7/1975 | Holmes | 338/48 |
| 3,996,551 | 12/1976 | Croson | 338/309 |

Primary Examiner—E. A. Goldberg
Assistant Examiner—M. M. Lateef
Attorney, Agent, or Firm—George H. Libman; James H. Chafin; Judson R. Hightower

[57] ABSTRACT

A standard thin film circuit containing $Ta_2N$ (100 ohms/square) resistors is fabricated by depositing on a dielectric substrate successive layers of $Ta_2N$, Ti and Pd, with a gold layer to provide conductors. The addition of a few simple photoprocessing steps to the standeard TFN manufacturing process enables the formation of $Ta_2N+Ti$ (10 ohms/square) and $Ta_2N+Ti+Pd$ (1 ohm/square) resistors in the same otherwise standard thin film circuit structure.

10 Claims, 4 Drawing Sheets

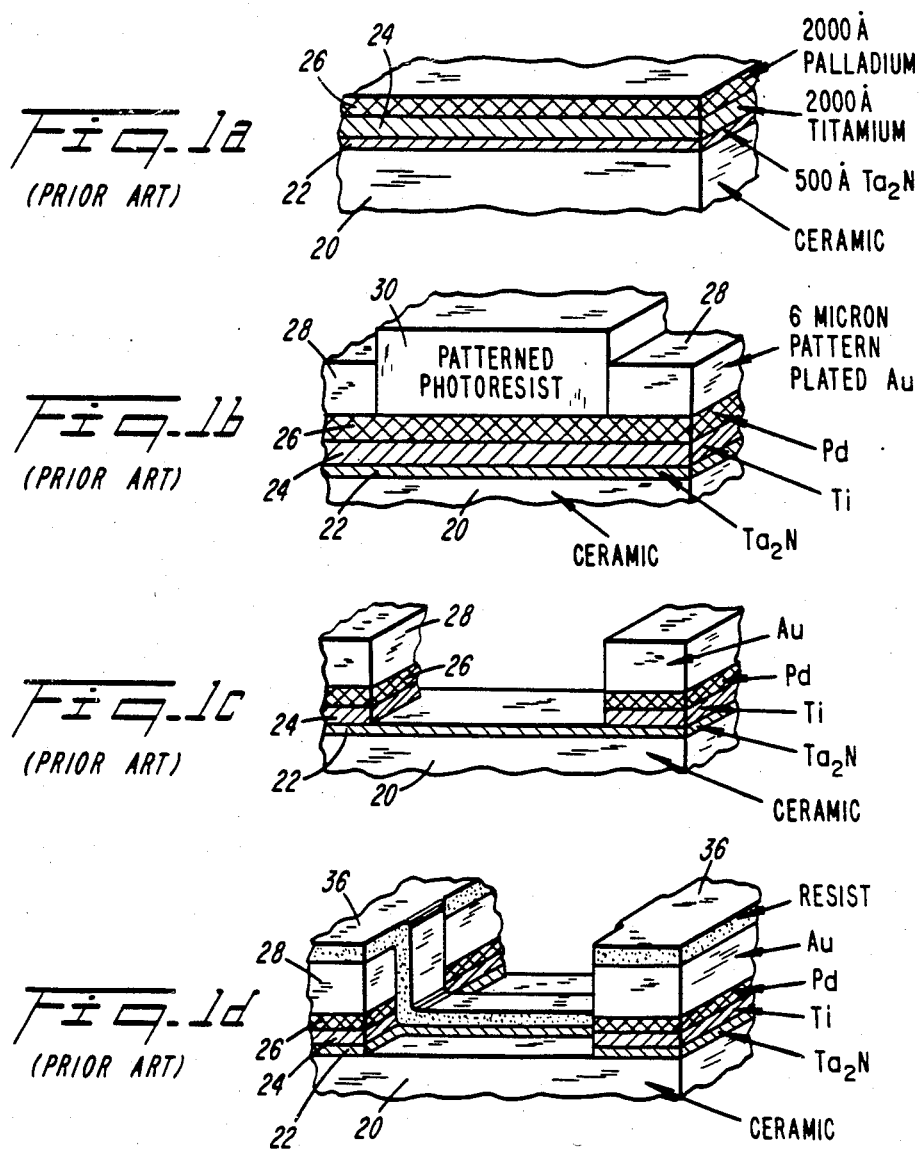

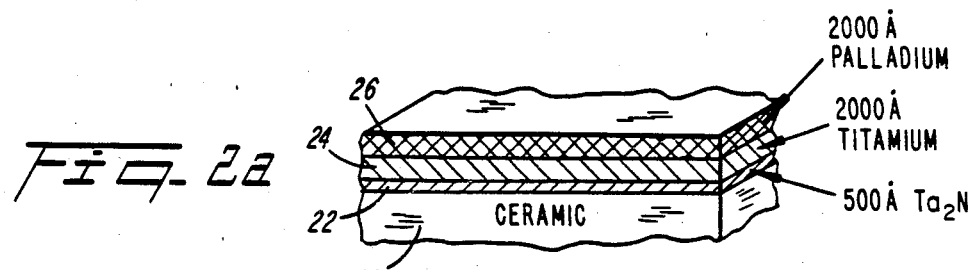
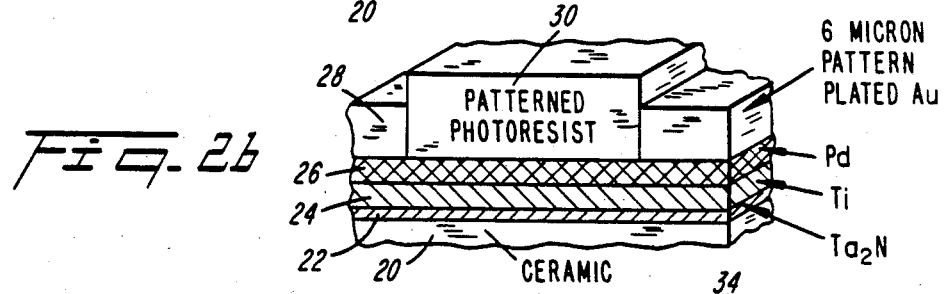
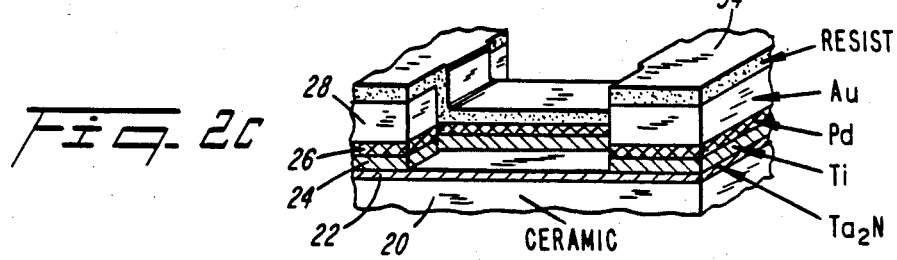
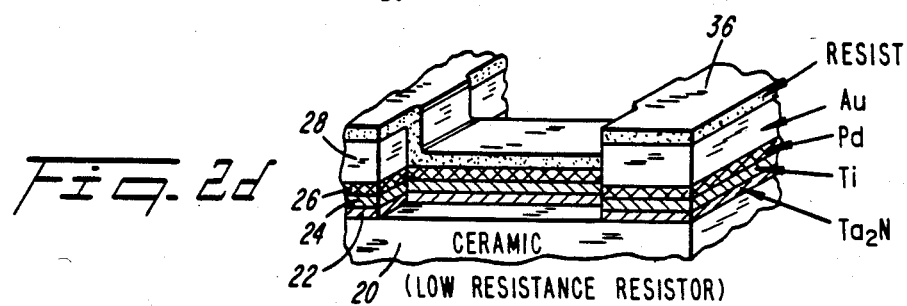
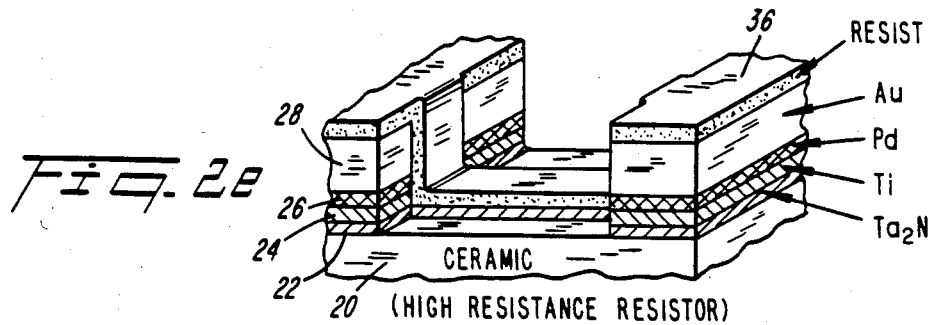

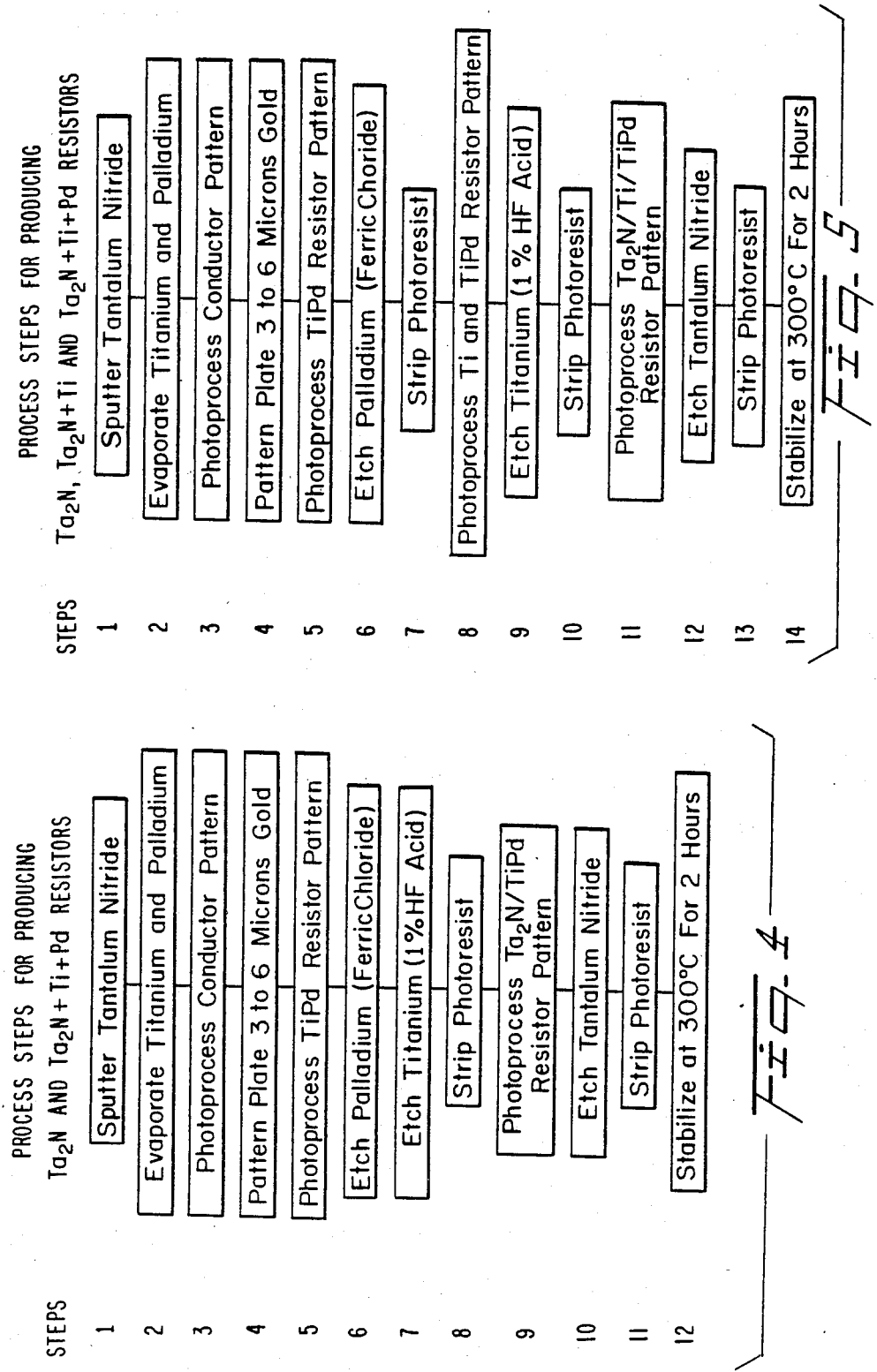

4,801,469

PROCESS FOR OBTAINING MULTIPLE SHEET RESISTANCES FOR THIN FILM HYBRID MICROCIRCUIT RESISTORS

The U.S. Government has rights in this invention pursuant to Contract No. DE-AC04-76DP00789 between the U.S. Department of Energy and AT&T Technologies, Inc.

FIELD OF THE INVENTION

This invention relates to a process for obtaining multiple electrically resistive layers on a dielectric substrate, and particularly to a process which forms resistor layers having different sheet resistances on the same thin film substrate.

HISTORY OF THE PRIOR ART

Only one high resistance layer, e.g., tantalum nitride ($Ta_2N$), has in the past been available to fabricate thin film network (TFN) resistors. Hence, this layer conventionally accommodates the majority of resistors needed in a given TFN circuit. If a low value resistor is required in the circuit, an externally attached resistor is often used. Alternatively, a prohibitively large area of the TFN circuit is necessary to produce a low value resistor from the $Ta_2N$ layer which has a high sheet resistance value.

The conventional thin film metallization process consists of depositing, by evaporation or sputtering, separate layers of tantalum nitride, titanium, palladium and gold, in succession, typically on a ceramic substrate base. A photolithography process is then used to define conductors and resistors in these metal layers, with conductors defined in the gold layer and resistors defined in the tantalum nitride layer. The titanium and palladium layers serve merely as adhesion and barrier layers for the gold metalization and are not used as resistors alone or with the $Ta_2N$. A 100 ohm/square resistance is feasible in the $Ta_2N$ layer. The generation of a low value resistor in the $Ta_2N$ layer would require photoprocessing precision to a very high resolution, not presently available, or would require a large amount of substrate area.

TFN hybrid circuit technology has been developed to the point where the products have a high reliability and a high life expectancy, consequently such circuits satisfy many military and commercial needs. This technology employs, inter alia, sputtering, vacuum deposition and controlled evaporation to produce successive very thin deposits on a ceramic substrate. At various stages in this deposition process, depending upon the circuit architecture contemplated, portions of the substrate or the deposits are selectively covered with carefully selected masking materials (typically photoresists) and the unmasked portions are then etched away with appropriate etchants. Well-known techniques exist for photodepositing of such masking materials, developing patterns and stripping of the masking material, and very high precision in such manipulations is readily available. The use of lasers to evaporate and trim away resistor metals, which permits the resistors to be adjusted to a very high degree of precision, is also known and commonly practiced in the technology. Persons skilled in the art, are therefore familiar with and able to use such techniques.

An alternative process utilizes thick film technology to generate different resistive values by proper selection from a wide variety of pastes having different sheet resistivities. However, many circuits require the smaller line width and conductor edge acuity possible only with thin film technology, hence thick film technology cannot be used to solve certain problems.

Regardless of the technique used, the resistors themselves should be accurate, stable, reliable, and immune to changes in ambient conditions. Also, the process for fabricating the resistors must be kept simple to permit high volume production of the overall device at a relatively low cost per unit.

One of the known methods for fabricating a plurality of metal thin film resistors having substantially different resistance values in a single semiconductor device is taught in U.S. Pat. No. 3,594,225, to Waits. In the Waits process, multiple resistances are obtained by initially forming an underlayer of low conductivity material on a portion of an insulating substrate, followed by the formation of a thin film resistance layer deposited over the underlayer and a portion of the substrate separate from the underlayer. Additional layers of low conductivity material may, if desired, be deposited thereafter. However, Waits depends on the microstructure variations between the substrate and the underlayer surfaces to cause substantially different values of resistance to be generated from the deposited thin film resistive material. The Waits process is evidently designed for semiconductor (solid state) devices and not for TFNs. Waits suggests a resistive film material comprising a composition of chromium disilicide, which may further comprise, inter alia, tantalum.

U.S. Pat. No. 3,996,551, to Croson, discloses a thin film resistive network having a range of resistivities, with a thin film of chromium-silicon oxide resistive material formed over a conventional substrate, with a mask and a second resistive layer of nickel-chromium formed thereon. The nickel-chromium layer is then etched to form low value resistors and contact points, and a passivation layer and electrical contacts are then applied to the resultant structure. The Croson techniques appears to be focused primarily on the contact resistance to thin film resistors and their accuracy or tolerance. The multiple resistance values are obtained as a by-product in an effort to gain better contact to the underlying resistor film, with the added nickel-chromium thin film intentionally deposited for this purpose.

U.S. Pat. No. 3,864,825, to Holmes, discloses a process in which several layers of different resistive materials are successively deposited on each other to provide different sheet resistivities, with the layer of highest resistivity being deposited first and other layers deposited thereon in order of decreasing resistivity. Successively deposited layers are then masked and portions thereof selectively removed by means of etchants which do not attack the underlying layers, thereby allowing the fabrication of different resistive values. Holmes, like Waits, proposes the use of tantalum as one of the resistor layers. It is believed that the Holmes process would inherently require considerable investigative study to determine the different combinations of materials, both to provide the different resistive values and to ensure that the circuit will maintain its physical integrity both during manufacture and under normal conditions of use.

There is, therefore, a need for a simple process for producing thin film networks having a variety of resistive values within the same structure, involving only conventional manufacturing steps and, therefore, an assurance of stability during manufacture and in subsequent use.

SUMMARY OF THE INVENTION

Accordingly, it is an object of this invention to provide a method to produce multiple resistive layers on a dielectric substrate having different sheet resistances. Another object is to provide a method of producing hybrid circuits having multiple layer thin film resistors with different sheet resistances.

Yet another object is to provide a method of producing, with conventional equipment and skills, a temperature-stable thin film network containing resistors with different sheet resistances.

An even further object is to provide a method of producing a thin film network with resistors of different sheet resistances that are all precisely laser trimmable.

These and other advantages of this invention are obtained by depositing on a dielectric substrate, successively, a first layer of tantalum nitride, a second layer of titanium and a third layer of palladium. A thin layer of gold is plated on selected portions of the palladium to provide conductive zones. Then by successive applications of masks and etchants selected portions of either the palladium, both the palladium and the titanium, or the palladium, titanium and tantalum nitride together, are removed to create a plurality of electrical resistors between pairs of adjacent gold plated conductive zones. The resistors have different specific resistances, i.e., a "low resistance" formed of tantalum nitride, titanium and palladium together in parallel, an intermediate resistance formed of tantalum nitride and titanium in parallel, and a "high resistance" formed of tantalum nitride alone. Two-level resistance circuits, containing such "low resistance" and "high resistance" resistors are obtained by omission of steps needed to create the "intermediate resistance" elements in the TFN.

Still other objects and advantages of the present invention will become readily apparent to those skilled in this art from the following detailed description, wherein only the preferred embodiment of the invention is shown, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

DESCRIPTION OF THE DRAWINGS

FIGS. 1a–1d are perspective schematic views of the sequential steps known in the prior art for fabricating a standard TFN.

FIGS. 2a–2e are perspective schematic views of the various steps in fabricating a TFN with low and high value resistors according to this invention.

FIGS. 4 and 5 are schematic diagrams of the sequential steps required to produce two and three resistivity levels, respectively, in a TFN according to this invention.

DESCRIPTION OF THE PREFERRED EMBODIMENT

Figure 3A:
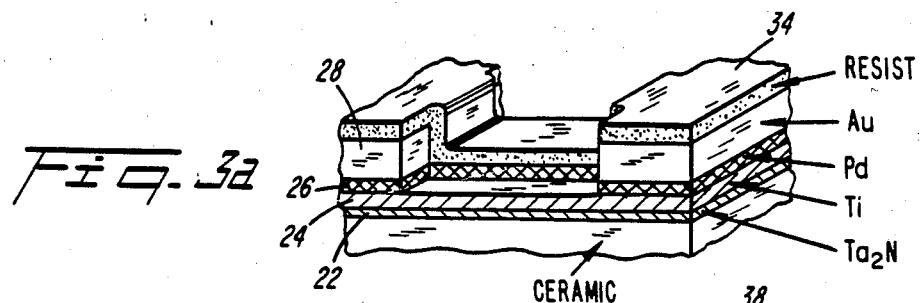
FIGS. 3a–3c are perspective schematic views of the sequential steps in fabricating a TFN with low, intermediate, and high value resistors according to this invention.

The metallization process for forming standard TFN circuit on a dielectric substrate is presented schematically in FIG. 1. Tantalum nitride ($Ta_2N$) usually is first sputtered onto a carefully prepared surface of a dielectric substrate. A typical thickness for the $Ta_2N$ layer is in the range 400 Å to 1200 Å. At the 500 Å thickness, this $Ta_2N$ layer has a sheet resistivity of approximately 100 ohm/square. Layers of titanium (Ti) and palladium (Pd) metal, each typically 2000 Å thick, are successively evaporated thereon, as shown in FIG. 1(a). These Ti and Pd layers have been utilized in the prior art TFN technology only to serve as a stable underlayer for the gold conductive layer to be deposited thereupon in a subsequent step, the gold layer defining conductive paths between each end of the resistor and other circuit elements, as is well known in the art.

Referring to FIG. 1(b), a photoresist pattern is then applied and processed on the Pd layer to provide a mask through which the gold, preferably in a layer 3 to 6 microns thick, is plated onto the unmasked surface areas of the Pd.

It should be noted that this much of the known single level ($Ta_2N$) resistor TFN manufacturing process is common to both the two-level ($Ta_2N$ and $Ta_2N$+Ti+Pd) and the three-level ($Ta_2N$, $Ta_2N$-Ti and $Ta_2N$+Ti+Pd) resistor processes taught by this invention. These initial steps are identified as Steps 1 through 4 of FIGS. 4 and 5, respectively, and the results are also schematically depicted in FIGS. 2(a) and 2(b). The processes of this invention depart from the prior art at this point, as discussed in detail hereinafter, and utilize the Ti and Pd layers with the $Ta_2N$ layer to add resistors characterized in having different sheet resistivities. In all these processes, the thin layer of gold provides conductive zones between which various resistors are formed in the final TFN circuits.

In the "prior art" single level $Ta_2N$ process, the gold-patterning photoresist is removed by stripping in the conventional manner. The Pd and Ti layers are then etched away from exposed zones, i.e., from the areas not covered by the gold. The Pd layer is conveniently etched with ferric chloride, and the Ti layer by a 1% solution of hydrofluoric acid. The result of this etching is that the $Ta_2N$ layer is thereby exposed, connecting the gold covered areas, and is available for the formation of single-level $Ta_2N$ resistors, as shown in FIG. 1(c).

A second photoresist pattern is then applied to define and mask the areas where the $Ta_2N$ resistors are to be created. This photoresist is also extended to cover the gold plated zones, because the etchant for removing the $Ta_2N$ will otherwise also attack the gold deposit. Excess $Ta_2N$ is then etched away from the unmasked areas, as shown in FIG. 1(d). The photoresist is stripped away to reveal the completed TFN circuit. This completes the prior art process of producing single level $Ta_2N$ resistors, with sheet resistivity of the order of 100 ohm/square, except for precise trimming, e.g., laser-trimming, if desired.

The preferred embodiments of the processes for producing two and three level resistors according to this invention, in otherwise conventional TFN layers, are described below in detail. The various numbered steps hereinafter are as numbered in FIGS. 4 and 5 and the results are depicted schematically in FIGS. 2 and 3.

Two-Level Resistor TFN Process (FIG. 4 Steps)

Step 1: Deposit a layer 22 of Ta$_2$N onto a surface of a dielectric substrate 20, preferably to a thickness of 500 Å, by a process such as sputtering.

Step 2: Deposit on the Ta$_2$N layer 22 a layer 24 of Ti, preferably to a thickness of 2000 Å, by a process such as evaporation. On the Ti layer 24 deposit a layer 26 of Pd metal, preferably to a thickness of 2000 Å, by a process such as evaporation (FIG. 2(a)).

Step 3: Photoprocess a first photoresist mask 30 on the Pd layer 26, preferably by a dry film photoresist technique, to define via unmasked or open portions a pattern for the subsequent deposit of a highly conductive material.

Step 4: Pattern plate a layer 28 of gold onto the areas of palladium not covered by the photoresist mask 30 of step 3, preferably to a thickness in the range 3–6 microns. The result is as schematically presented in FIG. 2(b). The photoresist mask 30 is then stripped.

Step 5: Photoprocess a second photoresist mask 34 on the exposed surfaces of gold 28 and Pd 26 to define, via unmasked or open portions thereof, a pattern for the etching of Pd and Ti layers. Note that this second mask 34 covers the gold layer to protect it from the etchants.

Step 6: Etch the exposed Pd layer 26 with ferric chloride in the conventional manner, thus exposing the underlying Ti layer 24.

Step 7: Etch the now exposed Ti layer 24 with 1% HF acid in the conventional manner, thus exposing the underlying Ta$_2$N layer 22. (FIG. 2(c)).

Step 8. The second photoresist mask 34 is stripped. At this point there are portions of the Ta$_2$N layer 22 that are covered with layers 24 and 26 of Ti and Pd, respectively, in those regions that will become the Ta$_2$N+Ti+Pd low resistance resistors in the final two-level TFN. The Ta$_2$N layer 22 at this point is continuous and those portions of it that are not covered by gold (over titanium and palladium) are available for the formation of Ta$_2$N "high resistance" resistors in the final two-level TFN.

Step 9: Photoprocess a third photoresist mask 36 on the exposed surfaces of the layers of gold 28, palladium 26 and tantalum nitride 22 to protect the covered portions thereof and to define via unmasked or open portions a pattern for the etching of excess Ta$_2$N to define the eventual Ta$_2$N+Ti+Pd "low resistance" and the Ta$_2$N "high resistance" resistors in the final two-level TFN. It should be noted the photoresist (36) covering the "low resistance" Ta$_2$N+Ti+Pd resistors serves only to protect them from the Ta$_2$N etchant.

Step 10: Etch the exposed Ta$_2$N layer 22. It is necessary to protect the gold layer 28 during this step as the etchant of Ta$_2$N, typically comprising a mixture of hydrofluoric, nitric and acetic acids, may damage gold. The result is as depicted in FIG. 2(d) for a typical Ta$_2$N+Ti+Pd "low resistance" resistor. FIG. 2(e) illustrates a typical Ta$_2$N "high resistance" resistor on the final two-level TFN.

Step 11: Strip the third photoresist mask 36. The result is to leave pairs of adjacent zones, with their topmost layers being conductive gold 28, with either a three layer element constituting a Ta$_2$N+Ti+Pd "low resistance" resistor (as illustrated in FIG. 2(d)) or a one layer element constituting a Ta$_2$N "high resistance" resistor (as illustrated in FIG. 2(e)) therebetween. Because any electric current flow through the low resistance resistor passes in parallel through the Ta$_2$N, Ti and Pd layers, this Ta$_2$N+Ti+Pd resistor has a final relatively low resistance value of approximately 1 ohm/square. By comparison a Ta$_2$N "high resistance" resistor has a resistance of approximately 100 ohm/square. A TFN containing both kinds of resistors is here referred to as a two-level TFN.

Step 12: The substrate with the different resistors formed thereon is then maintained in air, at approximately 300° C., for about two hours to stabilize the resistors.

Depending on the precision desired, one or more of the resistors may be conveniently laser-trimmed in a conventional manner to vaporize away a controlled amount of resistive material, i.e., Ta$_2$N alone for a "high resistance" resistor and the Ta$_2$N+Ti+Pd for a low resistance resistor, thereby to increase the resistance to the desired value. Persons skilled in the art who intend to so trim resistances should control the masking and etching steps to ensure that there is, in face, surplus material present to be so trimmed. Available photoresist masking techniques do allow quite precise structuring of TFNs, and such laser-trimming allows for even greater precision where needed.

Finer gradations in resistance structuring and value are possible by the addition of a few more steps to create a three-level TFN which will have "high resistance" Ta$_2$N, "intermediate resistance" Ta$_2$N+Ti (having a sheet resistance value of approximately 10 ohm/square) and "low resistance" Ta$_2$N+Ti+Pd resistors formed within the otherwise conventional three layers of a standard TFN. The three-level TFN is produced by the process described below. (See FIG. 3 and the steps of FIG. 5).

Three-Level Resistor TFN Process

Steps 1 through 6: These are identical with the first six steps of the two-level resistor process described above.

Figure 3B:
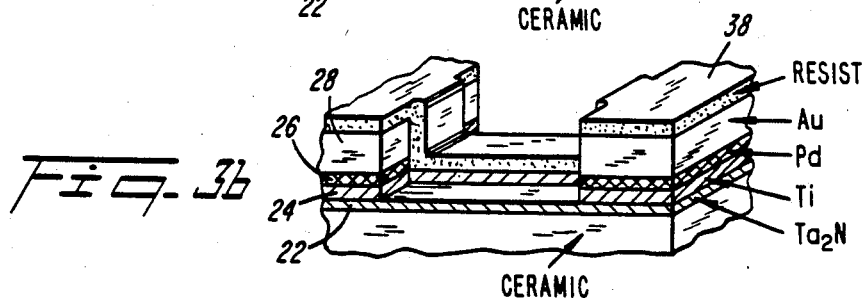
Figure 3C:
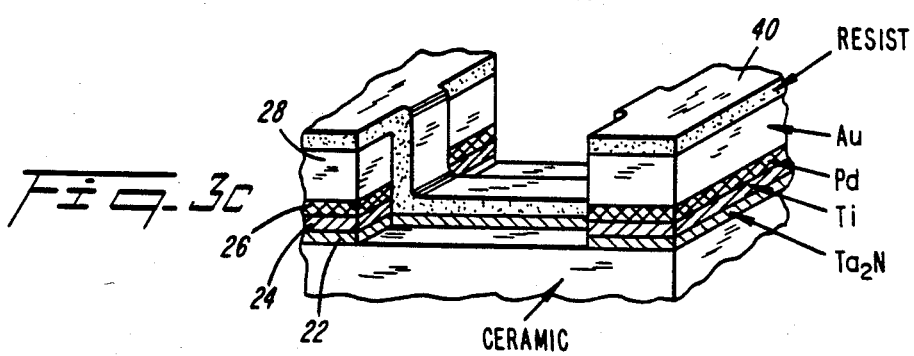

Note that the second mask 34 (FIG. 3(a)) to produce a three-level TFN must be designed to allow for selective etching of the Pd layer 26 above where the intermediate resistance Ta$_2$N+Ti resistors are to be formed. The exact locations and value selections of individual resistors are, of course, specific to each circuit and are within the province of the TFN circuit designer. Such specifics of TFN architecture are details independent of the process at hand.

Step 7: After completion of the Step 6 etching of Pd, the second photoresist mask 34 is stripped (FIG. 3(a)).

Step 8: Photoprocess a third photoresist mask 38 (FIG. 3(b)) to define, inter alia, where the Ti layer 24 is to be etched away so that the unetched areas provide the "intermediate resistance" Ta$_2$N+Ti resistors in the TFN. The resistors formed in step 6 at other locations on the circuit must be protected with photoresist to keep etchants used from attacking them.

Step 9: Etch the exposed Ti layer 24 with 1% HF acid in the conventional manner (FIG. 3(b)).

Step 10: Strip the third photoresist mask 38.

Step 11: Photoprocess a fourth photoresist mask 40 (FIG. 3(c)) to define, inter alia, where the Ta$_2$N layer 22 is to be etched away so that the unetched areas of Ta$_2$N provide the "high resistance" Ta$_2$N resistors in the TFN. Mask 40 must protect the gold 28 from the tantalum nitride etchant as well as the two types of resistors formed previously on other areas of the substrate.

Step 12: Etch the now exposed Ta₂N layer 22 (FIG. 3(c)). This step leaves between the conductively covered areas, as determined by the circuit designer's choice of mask patterns so far, a plurality of resistors having low, intermediate or high sheet resistance values, i.e., approximately 1, 10 or 100 ohm/square respectively, in a final tree-level TFN circuit.

Step 13: Strip photoresist mask 40 (FIG. 3(c)).

Step 14: Heat stabilize the TFN on the substrate at approximately 300° C., in air, for about two hours.

Individual resistors in a three-level TFN may be laser-trimmed as in a two-level TFN, if finer tolerance of particular resistor values are desired.

The two-level and three-level TFN production processes described above are believed to be particularly advantageous in that they merely add a few additional steps to commercially popular processes for manufacturing TFNs in which, to date, only the Ta₂N layer has been used to provide "high resistance" resistors. No new equipment should be needed and, because the additional mask photoprocessing and etching require no expensive or different skills or chemicals, the same personnel can be utilized to produce much more sophisticated TFNs. These processes therefore are highly cost-effective, and provide an improved product having the same operational stability as the standard TFNs now in wide use.

The tantalum nitride provides the conventional 100 ohms/square high resistance value. The tantalum nitride and titanium together provide intermediate sheet resistance values of the order of 10 ohms/square. Finally, the tantalum nitride, titanium and palladium together provide low sheet resistance values of approximately 1 ohm/square. A requirement of both the processes of this invention is that the conductive layer of gold be pattern plated due to the solubility of the palladium in gold etchants. This eliminates etching as a method of defining the gold conductors. It is thus possible to select one, two or three resistor layers using the methods of this invention with one or two more photolithography and etching steps in addition to those normally employed in the standard process.

The additional resistors produced by these processes are stable and well behaved, and have a significant power dissipation capability. These resistors are all laser trimmable to close tolerances with equipment compatible to that commonly used with tantalum nitride resistors as manufactured in the standard process.

Figure 6:
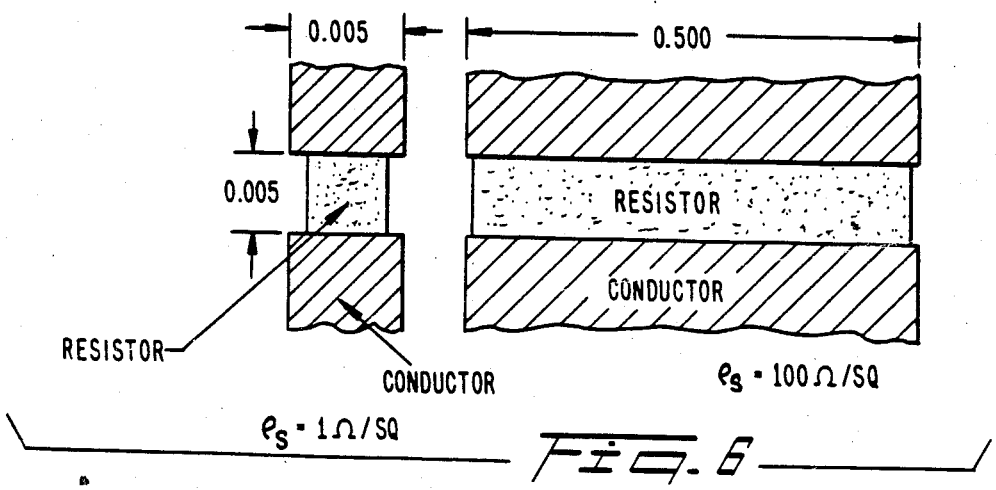
FIG. 6 is a vertical sectional view through a TFN to illustrate the TFN space needed for a 1 ohm resistor using low and high value sheet resistivities. resistors, both trimmed and untrimmed.

Work in developing the process of this invention indicated that it was possible to produce 1 ohm/square resistors on the same TFN circuits as the standard 100 ohm/square resistors. This allows small value resistors to be used in strip line circuitry and overcomes the typical layout space problem posed by larger sheet resistances. This layout space problem is best understood with reference to FIG. 6, where two 1 ohm resistors with large and small sheet resistivities are depicted. The resistor value is given by:

$$R = \rho_s L/W$$

where
R = resistor value,
$\rho_s$ = sheet resistances,
L = resistor length, and
W = resistor width, respectively.

The width of the 1 ohm/square resistor, for comparison, is 0.005 in. and that of the 100 ohm/square resistor is 0.5 in., when both have the length of 0.005 in. If attempts are made to change the length of the 100 ohm/square resistor to decrease resistance, photoprocessing limits of 0.003 in. are reached quickly. In other words, with the typical high resistivity of tantalum nitride, it is not practical to generate low resistances in the standard TFN which has only the tantalum nitride to provide electrical resistance. By contrast, the Ta₂N+Ti+Pd resistors produced according to the method of this invention readily provide the desired low resistances without the practical problems of impossible to achieve manufacturing tolerances. The same is true of the Ta₂N+Ti resistors in the TFN.

The only limitation of the products of the disclosed methods is that the resistors thus produced have a large, positive temperature coefficient of resistance (TCR). It is believed that this temperature sensitivity of resistors that include palladium is due to this element's TCR of 3,770 ppm/° C. in its elemental form. Tests indicate that the Ta₂N+Ti+Pd resistors can be expected to change about 1% for every 3° to 4° C. change in temperature. This high TCR appears to be a factor that may somewhat limit the use of such resistors for thin film circuits. However, this feature may be used to advantage, e.g., by utilizing the resistor as a current-limiting resistor. In such applications, the increase in resistance with temperature will work to reduce the current due to a resistance increase as the temperature increases in the circuit.

It should be apparent from the preceding that this invention may be practiced otherwise than as specifically described and disclosed herein. Modifications may therefore be made to the specific embodiments disclosed here without departing from the scope of the invention, and are intended to be included within the claims appended below.

What is claimed is:

1. A process of manufacturing on a surface of a substrate member a thin film network (TFN) circuit including a plurality of resistors formed of materials characterized by different resistivities, said process comprising the steps of:

depositing on said surface of said substrate a first layer comprising tantalum nitride (Ta₂N) to a first thickness, said Ta₂N layer having a high resistivity;

depositing on said first layer of Ta₂N a second layer comprising titanium metal (Ti) to a second thickness, the combined layers of Ta₂N+Ti having an intermediate resistivity;

depositing on said second layer comprising Ti a third layer comprising palladium metal (Pd) to a third thickness, said combined layers of Ta₂N+Ti+Pd having a low resistivity;

masking a first portion of said third layer and subsequently plating the remainder of said third layer with gold to form a plurality of conductive paths;

masking a second portion of said third layer and said conductive paths, and subsequently removing the remainder of both said third layer and said second layer to expose said first layer thereunder said masked second portion defining said low resistivity resistor between two conductive paths;

masking said low conductivity resistor, said conductive paths, and a third portion of said first layer exposed by the previous step, and subsequently removing the remainder of said exposed first layer, said masked third portion defining a resistivity resistor between two conductive paths in said TFN circuit.

2. A process according to claim 1, further comprising the step of:
stabilizing said TFN resistors on said substrate by maintaining it in air at a temperature of approximately 300° C. for approximately two hours.

3. A process according to claim 1, wherein:
said first thickness of said first layer comprising $Ta_2N$ is in the range 400 Å–1200 Å.

4. A process according to claim 3, wherein:
said second thickness of said second layer comprising Ti is approximately 2000 Å; and
said third thickness of said third layer comprising Pd is approximately 2000 Å.

5. A process according to claim 4, wherein:
said pattern plating of gold provides a gold plating thickness in the range 3–6 microns.

6. A process of manufacturing on a surface of a substrate a thin film network (TFN) circuit including a plurality of resistors formed of materials characterized by having, respectively, low, intermediate and high resistivities, said process comprising the steps of:
depositing on said surface of said substrate a first layer comprising tantalum nitride ($Ta_2N$) to a first thickness, said $Ta_2N$ layer having said high resistivity;
depositing on said first layer of $Ta_2N$ a second layer comprising titanium metal (Ti) to a second thickness, the combined layers of $Ta_2N$+Ti having said intermediate resistivity;
depositing on said second layer comprising Ti a third layer comprising palladium metal (Pd) to a third thickness, said combined layers of $Ta_2N$+Ti+Pd having said low resistivity;
masking an area of said third layer and subsequently plating the remainder of said third layer with gold to form a plurality of conductive paths;
masking said conductive paths and said third layer over a first portion of said area, and subsequently removing the remainder of said third layer to expose said second layer thereunder, said masked first portion defining said low resistivity resistor between two conductive paths;
masking said low conductivity resistor, said conductive paths, and said exposed second layer over a second portion of said area, and subsequently removing the remainder of said exposed second layer to expose said first layer thereunder, said masked second portion defining said intermediate resistivity resistor between two conductive paths; and
masking said intermediate and low resistivity resistors, said conductive paths, and said exposed first layer over a third portion of said area, and subsequently removing the remainder of said exposed first layer, said masked third portion defining said high resistivity resistor between two conductive paths.

7. A process according to claim 6, further comprising the step of:
stabilizing said TFN resistors on said substrate by maintaining it in air at a temperature of approximately 300° C. for approximately two hours.

8. A process according to claim 6, wherein:
said first thickness of said first layer comprising $Ta_2N$ is in the range 400 Å–1200 Å.

9. A process according to claim 8, wherein:
said second thickness of said second layer comprising Ti is approximately 2000 Å; and
said third thickness of said third layer comprising Pd is approximately 2000 Å.

10. A process according to claim 9, wherein:
said pattern plating of gold provides a gold plating thickness in the range 3–6 microns.

* * * * *